(12) United States Patent
Cheng et al.

(10) Patent No.: US 6,686,615 B1
(45) Date of Patent: Feb. 3, 2004

(54) FLIP-CHIP TYPE SEMICONDUCTOR DEVICE FOR REDUCING SIGNAL SKEW

(75) Inventors: S. J. Cheng, Hsinchu (TW); An-Hong Liu, Tainan (TW); Yeong-Her Wang, Tainan (TW); Yuan-Ping Tseng, Hsinchu (TW); Y. J. Lee, Tainan (TW)

(73) Assignees: Chipmos Technologies (Bermuda) Ltd. (BM); Chipmos Technologies Inc., Hsinchu (TW)

( * ) Notice: Subject to any disclaimer, the term of this patent is extended or adjusted under 35 U.S.C. 154(b) by 8 days.

(21) Appl. No.: 10/223,297

(22) Filed: Aug. 20, 2002

(51) Int. Cl.[7] ............................................. H01L 29/73
(52) U.S. Cl. .................. 257/208; 257/203; 257/775
(58) Field of Search ................................. 257/203, 208, 257/773, 775

(56) References Cited

U.S. PATENT DOCUMENTS 5,994,766 A * 11/1999 Shenoy et al. ............. 257/659
6,025,647 A *  2/2000 Shenoy et al. ............. 257/775

* cited by examiner

Primary Examiner—Roy Potter
(74) Attorney, Agent, or Firm—Dennison, Schultz & Dougherty

(57) ABSTRACT

A flip chip type semiconductor device for reducing signal skew includes: a chip with bonding pads, and a plurality of bumping pads on the chip. Between each bonding pad and corresponding bumping pads is connected with a metal redistribution trace covered by a passivation layer. Each metal trace has an equal trace length for reducing signal skew.

5 Claims, 5 Drawing Sheets

FLIP-CHIP TYPE SEMICONDUCTOR DEVICE FOR REDUCING SIGNAL SKEW

FIELD OF THE INVENTION

The present invention relates to a flip-chip type semiconductor device for reducing signal skew and, more particularly, to a flip-chip type semiconductor device having equal lengths of redistribution traces for reducing signal skew.

BACKGROUND OF THE INVENTION

With recent remarkable advances in the semiconductor industry, the features of IC devices are continuously reduced and the circuit densities have correspondingly increased. As a result, the operation speed is also increased. As the operation speed of the IC device increases, the requirement for a shorter time traveling between I/O pins becomes higher. Signal misjudged, delayed, or even lost occurs when signals are unable to traverse from one point to another simultaneously according to system clock. Therefore, to pursue ways to effectively resolve the signal skew problem in the high-speed IC device industry is imperative.

In general, high-speed IC device (die) with flip chip type has bumps to combine with a printed wiring board to acquire a shorter transmission path and a higher I/O density. Usually there are a plurality of distribution metal traces connecting with bumps on an active surface of the IC device (die). However, if the metal traces of die are not properly designed, time delays between signal transmissions will occur, resulting in signal skew. To reduce signal skew in bumped die, a solution was proclaimed in the U.S. Pat. No. 6,025,647 entitled "APPARATUS FOR EQUALIZING SIGNAL PARAMETERS IN FLIP CHIP REDISTRIBUTION LAYERS", as shown is FIG. 1, which is an exemplary portion of an equalized redistribution layer. It referred to an equalized redistribution layout cell 306 having bumping pads 304a and 304c as the outer connected points of signal 1 and signal 4 respectively. The bumping pad 304a is connected to a narrower redistribution trace 406 which conducted to a bonding pad 202b for a shorter distance, while the bumping pad 304c is connected to a wider redistribution trace 404 which conducted to a bonding pad 202f for a longer distance. The lengthy trace 404 has wider trace so as to control and ensure that the redistribution traces 404 and 406 have the same characteristic impedance to reduce signal skew. Yet to acquire the corresponding widths of the different lengths of redistribution traces, the characteristic impedance had to be deliberately calculated. This increases the difficulties of circuit designs, and so as to the manufacture.

SUMMARY OF THE INVENTION

A main purpose of the present invention is to supply a flip chip type semiconductor device for reducing signal skew. Redistribution traces with equal lengths are applied to acquire simple circuit design to reduce signal skew.

A second purpose of the present invention is to supply a flip chip type semiconductor device having a redistribution trace with narrow width to pass through the narrow spacing between laser fuse windows. The redistribution trace with narrower width is thicker than other traces to equalize the characteristic impedance, and so as to avoid signal skew and difficulties in calculation.

In accordance with the present invention, a flip chip type semiconductor device for reducing signal skew mainly comprises a chip formed with circuits and a plurality of bonding pads on a surface. A redistribution layer includes a plurality of bumping pads and redistribution traces arranged on the surface of the chip. The redistribution traces are configured to connect the bonding pads to the corresponding bumping pads. Wherein each of the redistribution traces has equal length selected to reduce signal skew. A passivation layer is formed on the surface of the chip to cover the redistribution traces but expose surfaces of the bumping pads for forming bumps.

DETAIL DESCRIPTION OF THE INVENTION

Figure 1:
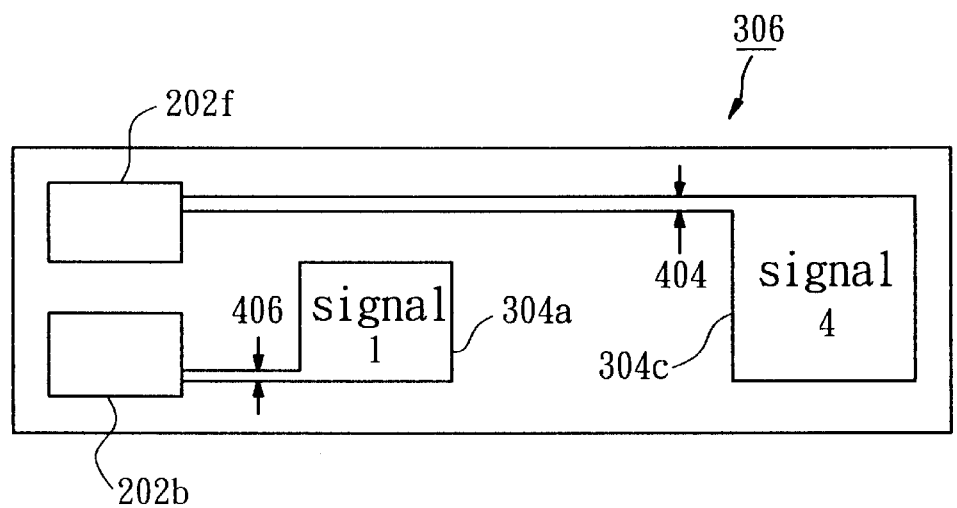
FIG. 1 is a top view of a portion of a redistribution layer according to the U.S. Pat. No. 6,025,647 entitled "APPARATUS FOR EQUALIZING SIGNAL PARAMETERS IN FLIP CHIP REDISTRIBUTION LAYERS"

Please referring to the drawings attached, the present invention will be described by means of embodiments below.

Figure 2:
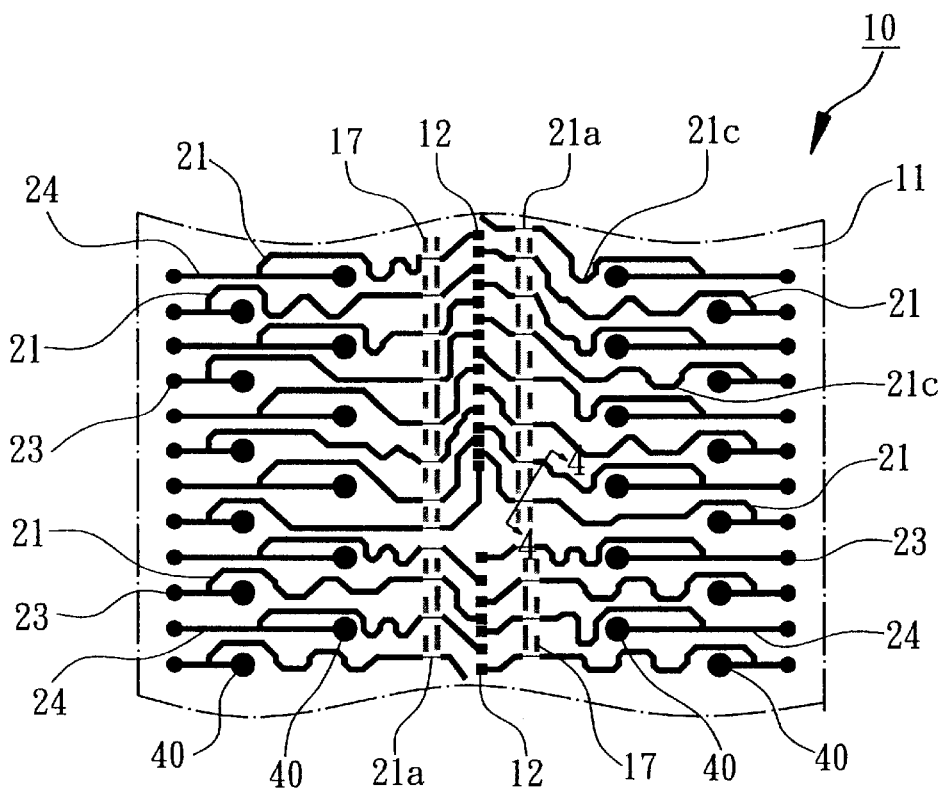
FIG. 2 is a top view of a portion of a flip chip type semiconductor device in accordance with a first embodiment of the present invention.
Figure 3:
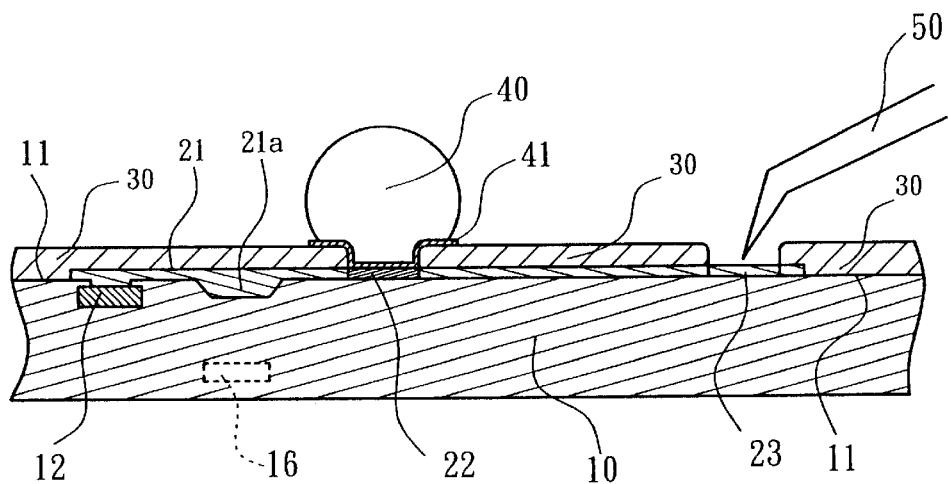
FIG. 3 is a cross-sectional view taken along one of the redistribution traces of the flip chip type semiconductor device in accordance with the first embodiment of the present invention.
Figure 4:
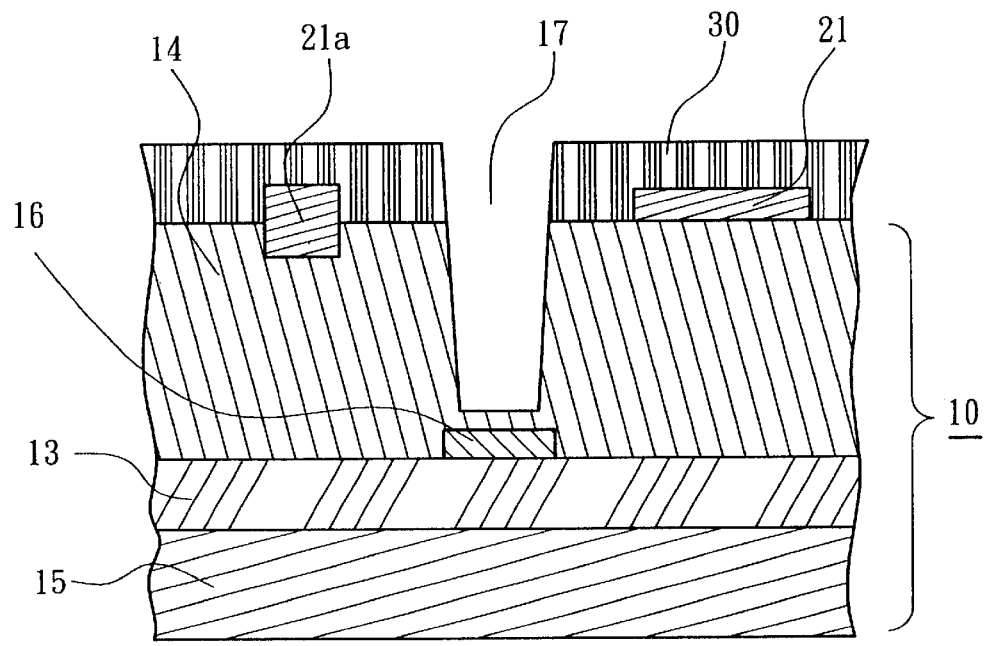
FIG. 4 is a cross-sectional view taken along the line 4—4 of FIG. 2.

As shown in FIGS. 2 and 3, the first embodiment in accordance with the present invention, a flip chip type semiconductor device mainly comprises a chip 10 with integrated circuits arranged on the surface 11, and a plurality of bonding pads 12 which connect to inside of integrated circuits. In this embodiment, bonding pads 12 are patterned near a center of the surface 11 of chip 10, that is arranged along a center line of the surface 11. Alternatively, the bonding pads 12 can also be arranged around the periphery of surface 11. (not shown in figure) In this embodiment, the chip 10 is a memory chip or a chip includes memories. Normally, as shown in FIGS. 3 and 4, the chip 10 comprises a silicon substrate 15, a first insulating layer 13, and a second insulating layer 14. The insulating layer 13 placing right on top of the silicon substrate 15 is a dielectric such as silica, PSG, BPSG, or TEOS, the so-called field oxide. The second insulating layer 14 formed on top of the first insulating layer 13 normally has multi-layer complex configuration to structure integrated circuits and fuse 16, and consequently the fuses 16 may sink in the second insulating layer 14. The second insulating layer 14 right over the fuses 16 is purposely made thinner to form hollow fuse windows 17 so that a laser may "burn" fuse 16 in the latter processes. The fuse windows 17 are designed on both sides of bonding pads 12, meanwhile, the second insulating layer 14 has openings for bonding pads 12, that is the so called bare chip structures. The fuses 16 are made of a substance such as tungsten, polycrystalline silicon, aluminum or polycide, which electrically connect to redundant circuits to replace the damaged memory cells by laser repair.

As shown in FIGS. 2 and 3, a plurality of redistribution traces 21 and bumping pads 22 arranged on the surface 11 of chip 10 (right over the second insulating layer 14) are formed by deposition and etching of wafer treatment processes. Wherein the redistribution traces 21 electrically connect bumping pads 22 with bonding pads 12, and at least one of the redistribution traces 21 has a winding route 21c so that all of these redistribution traces 21 have equal lengths for reducing signal skew. In addition, at least one of the redistribution traces 21 has a narrower trace 21a than other portion of the redistribution traces 21 in order to pass through the fuse windows 17. These narrower traces 21a are thicker than other portions of the redistribution traces 21 to equalize the characteristic impedance for reducing signal skew. (as shown in FIG. 4) In this embodiment, testing pads 23 (or testing bumps) and test connecting traces 24 connecting with redistribution traces 21 are also arranged on the surface 11 of the chip 10. The testing pads 23 locate on the peripheries of surface 11, and the test connecting circuits 24 connect the testing pads 23 to the redistribution traces 21. A flip-chip passivation layer 30 covers the surface 11 of chip 10, and it is made of the same substances as the second insulating layer or low K substances-such as polyimide, and benezo cyclobutene. The passivation layer 30 covers the redistribution traces 21, test connecting traces 24, and at least exposes partial surfaces of bumping pads 22 and testing pads 23. Each of the bumping pads 22 connects with a bump 40, made of lead-tin alloy or gold or lead-free materials, for bumped chip 10. Preferably, An Under Bump Metallurgy 41, is a composite metal layer such as Cr—Cu (chromium-copper) or Ti—Cu—Ni (titanium-copper-nickel), is arranged between bumps 40 and bumping pads 22 and bond bump 40 and bumping pad 22 to prevent forming of intermetallic layer which caused reliability issues in the applications and to prevent unwanted electron migration. The extended testing pads 23 are for the probe needles 50 to probe and test.

Figure 5A:
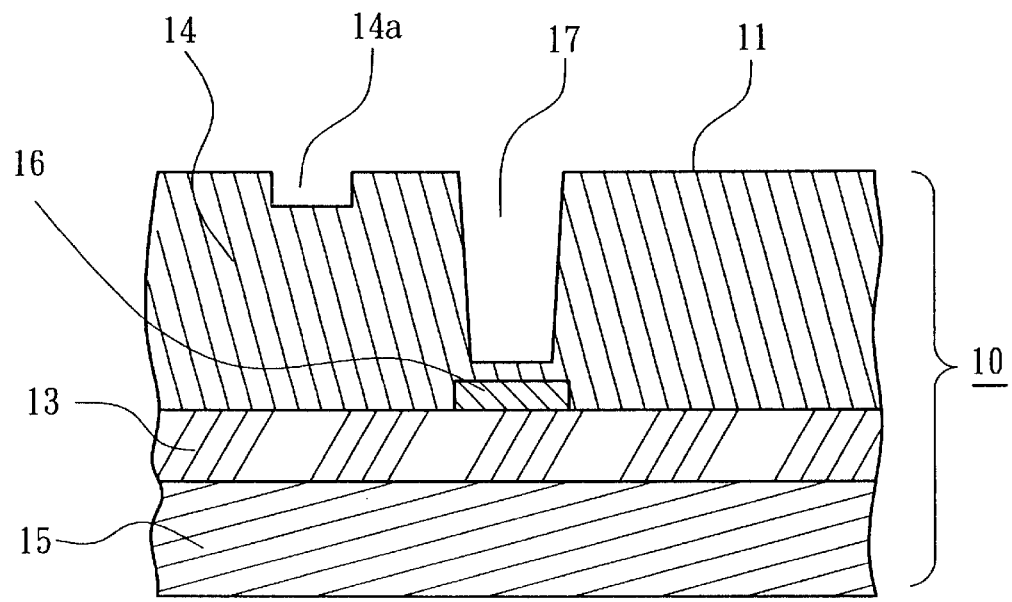
FIG. 5a to FIG. 5c are cross section views of the formation of redistribution traces of the flip chip type semiconductor devices in accordance with the first embodiment of the present invention.
Figure 5B:
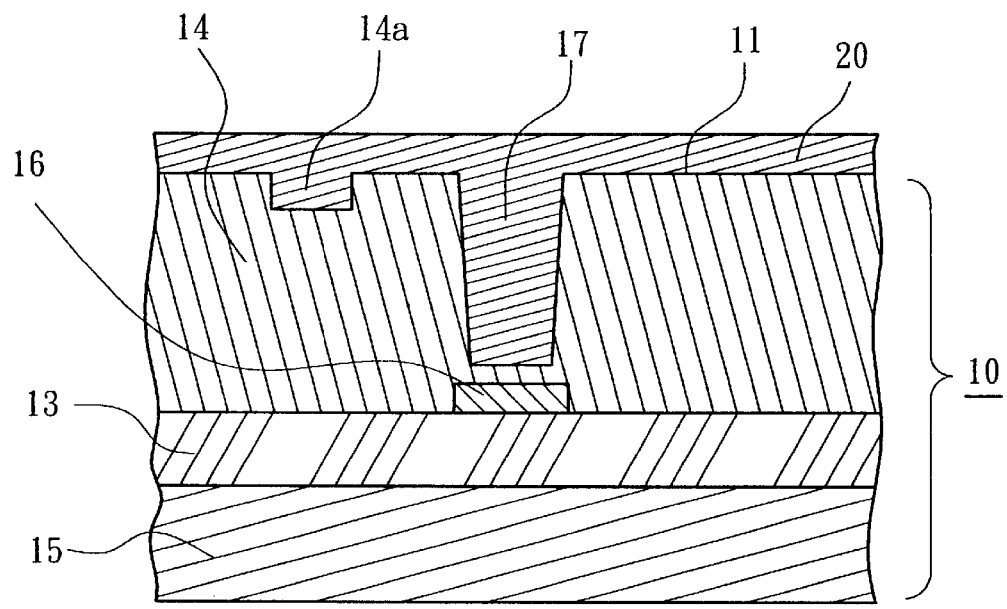
Figure 5C:
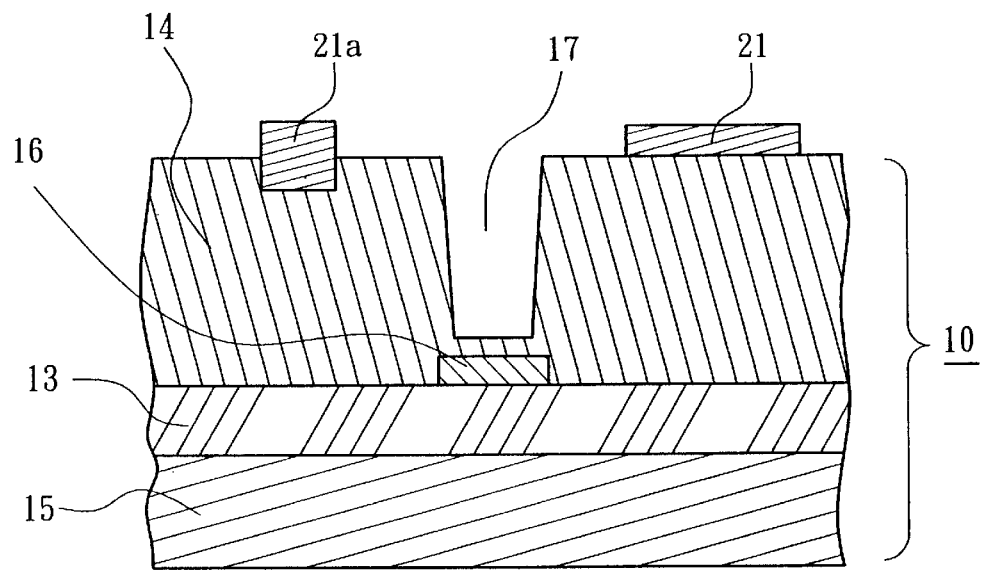

While the narrower traces 21a of the redistribution traces 21 pass through the spacings between laser fuse windows 17, it does not affect the laser repair in the latter processes. Besides, the narrower trace 21a is also thicker than other portions of trace 21 so that the redistribution traces 21 may have equal characteristic impedance from one end (bonding pads 12) to the other (bumping pads 22) to prevent signal skew. When the flip chip semiconductor device is utilized in high-speed semiconductor devices, it can reduce the difficulties in the designs and layouts of the redistribution traces 21. FIGS. 5a to 5c are cross section views of the formation of redistribution traces 21 according to the first embodiment of present invention. As shown in FIG. 5a, a chip 10 with integrated circuits, bonding pads 12 and a plurality of fuses 16 is provided. The surface 11 of chip 10 is formed by the second insulating layer 14. After partially etching the second insulating layer 14, slots 14a are formed between the fuses 16 on the second layer 14. Then, as shown in FIG. 5b, a metal layer 20 is formed on top of the second insulating layer 14 by deposition, sputtering or plating. It is preferably to use CMP (Chemical-Mechanical-Polishing) to grind the metal layer 20 after it is formed to make it a flat surface. Afterwards, as shown in FIG. 5c, selectively etching the metal layer 20 with lithography and etching technology. The metal layer 20, protected by a patterned photo resist, form a plurality of redistribution traces 21, wherein the one pass through the slots 14a has a narrower trace 21a yet with thicker metal film than others. Consequently, the redistribution traces 21 are formed on the surface 11 of chip 10 as described in the first embodiment. Finally, the steps of the formation of passivation layer 30 and bumps 40 are executed. Normally, from a bare chip to the formation of the bump 40, chip 10 is processed all in the wafer and then sawed to become individual flip chip semiconductor devices.

Figure 6A:
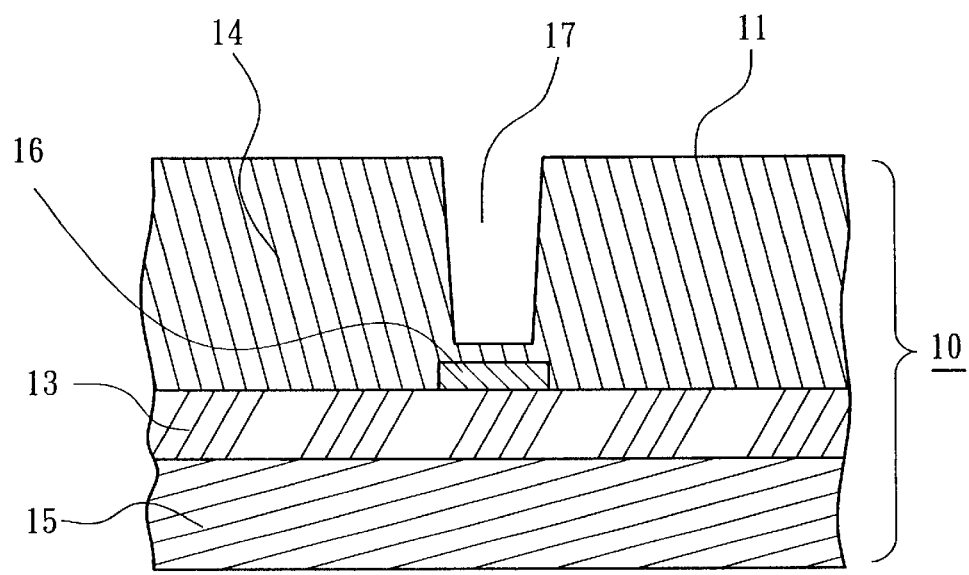
FIG. 6a to FIG. 6c are cross section views of another formation of redistribution traces of the flip chip type semiconductor devices in accordance with a second embodiment of the present invention.
Figure 6B:
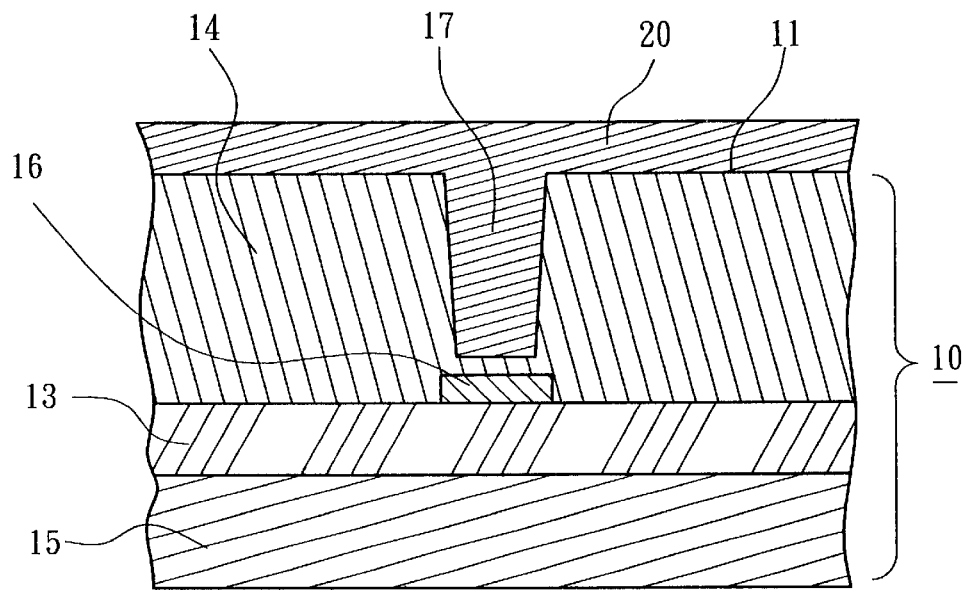
Figure 6C:
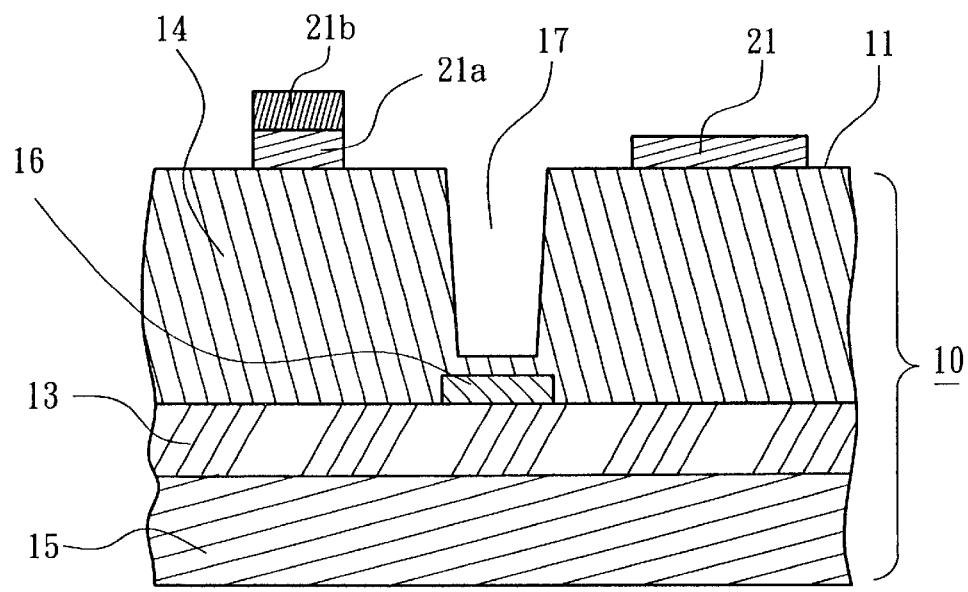

Another formation of the redistribution traces in flip chip semiconductor devices is disclosed in FIGS. 6a to 6c. As shown in FIG. 6a, a chip 10 with integrated circuits, bonding pads 12 and a plurality of laser fuses 16 is provided. Then, as shown in FIG. 6b, a metal layer 20 formed by deposition, sputtering or plating is arranged on top of the second insulating layer 14. Finally, as shown in FIG. 6c, the metal layer 20 is selectively etched to form a plurality of redistribution traces 21. Each redistribution trace 21 has a narrower trace 21a to pass through the fuse windows 16. Another metal layer 21b is deposited on the narrower trace 21a to make it thicker than others of the redistribution trace 21 and so as to equalize the characteristic impedance in the narrower trace 21a.

The above description of embodiments of this invention is intended to be illustrative and not limiting. Other embodiments of this invention will be obvious to those skilled in the art in view of the above disclosure.

What is claimed is:

1. A flip chip type semiconductor device comprising:

a chip having a surface formed with integrated circuits and a plurality of bonding pads;

a plurality of bumping pads arranged on the surface of the chip;

a plurality of redistribution traces arranged on the surface of the chip and connecting the bonding pads to the corresponding bumping pads, wherein at least one of the redistribution traces has a winding route so that all of the redistribution traces have equal lengths for reducing signal skew;

a passivation layer formed on the surface of the chip to cover the redistribution traces and exposing at least partial surfaces of the bumping pads; and a plurality of bumps formed on the bumping pads and electrically connecting to the corresponding bumping pads.

2. The flip chip type semiconductor device according to claim 1, wherein an Under Bump Metallurgy is formed between bumps and the bumping pads.

3. The flip chip type semiconductor device according to claim 1, wherein the plurality of bumping pads are arranged in a grid array fashion.

4. The flip chip type semiconductor device according to claim 1, wherein the bonding pads are arranged on a center of the surface of the chip.

5. The flip chip type semiconductor device according to claim 1, wherein the chip has a plurality of fuses and hollow fuse windows are formed on the surface of the chip, each redistribution trace has a narrower trace passing through the corresponding fuse window, and the narrower trace is thicker than the other portion of the redistribution trace to complement characteristic impedance of the redistribution trace.

* * * * *